United States Patent [19]

Williams

[11] 4,094,703
[45] June 13, 1978

[54] SOLAR ENERGY CONVERTER

[75] Inventor: Gregory J. Williams, Ithaca, N.Y.

[73] Assignee: Cornell Research Foundation, Ithaca, N.Y.

[21] Appl. No.: 755,775

[22] Filed: Dec. 30, 1976

[51] Int. Cl.² .......................................... H01L 31/04
[52] U.S. Cl. ........................... 136/89 TF; 136/89 AA; 313/96; 250/208
[58] Field of Search ..................... 136/89 TF, 89 AA; 313/94, 96, 97; 250/208

[56] References Cited
U.S. PATENT DOCUMENTS

| | | | |
|---|---|---|---|
| 2,052,542 | 8/1936 | Thomas | 136/89 X |
| 3,058,022 | 10/1962 | Coleman | 313/96 |
| 3,089,043 | 5/1963 | Gold | 307/149 |
| 3,121,648 | 2/1964 | Jensen | 136/89 |
| 3,218,196 | 11/1965 | Jensen et al. | 136/89 |
| 3,263,101 | 7/1966 | Geer | 310/4 |
| 3,510,714 | 5/1970 | Geer | 313/94 |

OTHER PUBLICATIONS

A. S. Jensen et al., "Photoelectric Conversion," *Proc. 14th Power Sources Conf.*, pp. 46–49, (1960).

Primary Examiner—Richard L. Andrews
Assistant Examiner—Aaron Weisstuch
Attorney, Agent, or Firm—Jones, Tullar & Cooper

[57] ABSTRACT

An improved solar energy converter comprising a plurality of electrically conductive, photoemitting electrodes geometrically arrayed so that light will strike only one surface of each to produce electron emission. The electrodes are in a spaced, generally parallel relationship so that electrons emitted by the illuminated surface of one electrode will travel to, and be collected by, a non-illuminated surface of a next adjacent electrode. A vacuum surrounds the electrodes so that only space conduction occurs. Each electrode has one surface which acts as a photoemitting cathode and one surface which acts as an electron collector, or anode, and thus each pair of adjacent electrode surfaces is analagous to a voltage cell, the plurality of electrodes forming a solar energy battery.

11 Claims, 6 Drawing Figures

SOLAR ENERGY CONVERTER

BACKGROUND OF THE INVENTION

The present invention relates to photoemissive devices, and more particularly to a solar energy converter comprising a plurality of photoemitting electrodes arranged to produce electrical power in usable form from solar energy.

In seeking a solution to the continuing problem of developing an efficient and practical source of electrical power which does not require the use of fossil fuels, a great deal of attention has been directed to the harnessing of solar energy. The art of converting such energy directly into electrical power has developed rapidly in recent years, particularly for applications in outer space where conventional power supplies are less than satisfactory. The need for an efficient, reliable, compact source of usable quantities of power at a reasonable cost has led to a proliferation of photoelectric devices utilizing various structures, materials, and techniques, principally relying on the photovoltaic properties of various semiconductors.

Some attempts have been made to utilize the photoemissive characteristics of metals and metal alloys to produce electrical currents of usable magnitude, but principally such photoemitters have been used in the detection or measurement of light, rather than in the generation of power. Typical of such attempts are U.S. Pat. Nos. 3,263,101 and 3,510,714 to C. W. Geer, both of which disclose photoemissive devices to convert solar energy into electrical current. These patents disclose the provision of large-area cathodes and anodes, wherein one or the other electrode is also a reflector which concentrates light. But such devices still have the disadvantage of being bulky, hard to handle, difficult to manufacture, and expensive. They are not, therefore, suitable either for use in outer space, where their bulk and manner of construction virtually precludes such an application, or for terrestrial use, where the large size required of such devices for useful levels of power, together with their expense, make them impractical and unsuitable.

As is well known, the phenomenon of photoemission, wherein electrons are ejected from a surface located in a vacuum and exposed to light energy, is exhibited by many materials, although the efficiency of this conversion varies with the material and with the wavelength of the light. Since light or shorter wavelengths contains a higher level of energy, more materials will exhibit photoemission in applications where ultraviolet light is present, as in outer space where the ultraviolet rays are not screened by the earth's atmosphere. However, some metals, such as cesium, as well as metal alloys and numerous semiconductive materials photoemit electrons upon exposure to light radiation in the visible wavelength range, with cesium cells being responsive, for example, to infra-red radiation as well.

To efficiently convert solar energy to electrical energy by photoemission, then, it is necessary to select a material which will serve as a cathode to emit electrons in the presence of light energy and to provide an anode for receiving the emitted electrons. The cathode must be highly illuminated by light energy of the appropriate wavelengths to insure emission of a large quantity of electrons, and the anode must be so located as to intercept a high proportion of the electrons. However, the geometrical arrangement of the anode and cathode must be such that the anode will not cast a shadow on the cathode so that maximum use of the cathode surface is obtained. Further, the anode itself must be so positioned that light does not fall on it, lest photoemission from the anode surface reduce the effective forward current flow alternately, the anode must be of a non-emitting material.

Numerous solar energy converters have been developed to take advantage of the ability of materials to photoemit electrons, but all have suffered disadvantages. Many are complex and time consuming to manufacture, many require exotic materials which are expensive and are difficult to handle, and many are limited in their applications and cannot be used, for example, in both outer space and terrestrial environments. In addition, many of the prior art devices encounter space charge limitations which prevent a significant flow of current, thus severely restricting their usefulness as power sources.

SUMMARY OF THE INVENTION

The present invention avoids the shortcomings and difficulties of the prior art through the provision of an array of photoemissive cathodes and receiver anodes which may be easily and relatively inexpensively manufactured, has a configuration which is compact, yet is efficient and thus is capable of producing a high level electrical output, and which may be used in a variety of applications. In its preferred form the invention comprises a plurality of electrically conductive electrode elements of a material which exhibits photoemission in the presence of light. The elements are aligned in substantially parallel, spaced rows, are mounted on an insulating base, and are surrounded by a vacuum. The electrode elements are arranged so that light falls only on one surface of each electrode, which the illuminated surface forming a photoemitting cathode. A second surface of each electrode is so positioned that the incident light does not fall on it, and it can therefore act as a collector anode for the electrons ejected by its next adjacent photoemitting surface. The spaced electrode elements thereby form a series of opposed cathode and anode surfaces separated by a vacuum, each set of cathode and anode surfaces and the intervening space defining a photoemissive voltage cell. The plural spaced elements thereby form a series of voltage cells which may be termed a solar battery, capable of being connected as a source of electrical energy in an electrical circuit. The voltage of the source is dependent on the number of cells and the available power depends upon the intensity of the light impinging on the cathode surfaces, the area of such surfaces, the material of the photocathode, and like considerations. Although the operation of photoelectric devices as power sources is generally known, the present invention is unique in providing a high voltage source capable of delivering usable levels of power efficiently.

The invention is further directed to the method of generating electrical power by means of the foregoing apparatus, and thus includes the steps of mounting a plurality of electrically conductive electrodes in spaced parallel insulative relationship, providing at least a photoemissive cathode surface on each electrode, all said cathode surfaces facing in a common direction, evacuating the space between said electrodes, illuminating only said cathode surfaces to produce photoemitted electron flow from each cathode, positioning a nonilluminated surface of each of said electrodes to intercept electrons emitted by a next adjacent cathode surface, whereby adjacent cathode and collection surfaces form voltage cells, and connecting the voltage cells in series to provide a voltage source having an output corresponding to the incident light.

BRIEF DESCRIPTION OF THE DRAWINGS

The foregoing and additional objects, features and advantages of the present invention will be more fully understood from a consideration of the following detailed description thereof, taken in conjunction with the accompanying drawings, in which.

DESCRIPTION OF PREFERRED EMBODIMENTS

Figure 1:
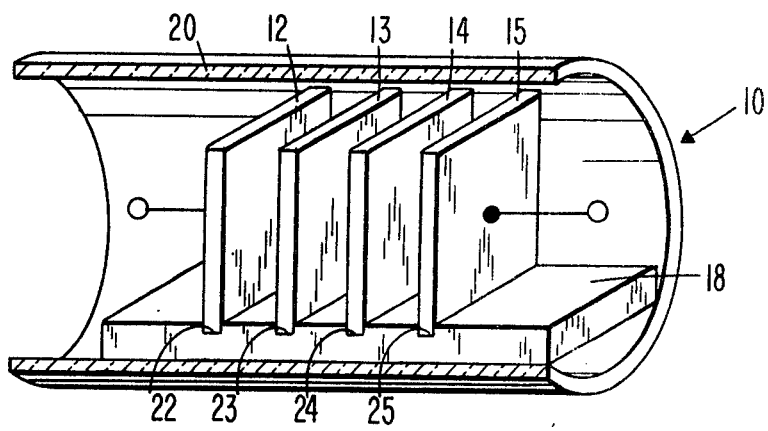
FIG. 1 is a perspective view of one form of the invention.

Turning now to a detailed consideration of the present invention, there is generally illustrated at 10 in FIG. 1 a light converter in accordance with the present invention. The converter is shown in a diagrammatic form which is illustrative of the principles involved, and incorporates a plurality of electrode elements 12, 13, 14 and 15 mounted on an electrically insulating base, or support 18 within a vacuum chamber 20. The elements 12-15 are constructed of an electrically conductive material which also is photoemissive, the particular material selected for the elements depending upon the use to which the converter is to be put. If, for example, the converter is to be operated in a light source having a strong concentration of ultraviolet wavelengths, the material could be a metal such as aluminum, which is photoemissive in response to impinging ultraviolet rays, but is less responsive to light of longer wavelengths, and exhibits little photoemissivity in the presence of visible light. Such a material would be useful in outer space applications, for example, where the earth's atmosphere would not absorb the ultraviolet components of light from the sun, but would be less satisfactory in converting solar energy in a terrestrial application. On the other hand, if the device is intended for use where response to a broader range of wavelengths is desirable, an electrically conductive material which incorporates a compound or an alloy of a photoemissive material such as cesium, which responds to a wide spectrum of light wave frequencies, may be used.

The photoemissive electrode elements 12-15 may be constructed in a variety of ways, depending on the material to be used, and in accordance with known techniques. Thus, elements 12-15 may simply be cut from aluminum or other metal sheeting, or may be formed by laminating or coating a photoemissive material to a suitable electrically conducting base material. Because of the large number of available materials that exhibit the required characteristics of electrical conductivity and photoemissivity, the particular material used may be selected on the basis of its suitability in view of such factors as the relative costs of the materials, their availability, their stability in the particular environment in which the converter is to operate, the nature of the light source, and the like.

The supporting base 18 may be of epoxy, ceramic, or other electrically insulating material but again the particular material will depend on factors such as the environment in which the device is to operate. When the converter is operated in a closed vacuum chamber, the base must be constructed from a material which has a low vapor pressure, so that it will not contaminate the converter elements or the surrounding vacuum. Moldable materials such as epoxy are suitable, as are solid, machinable materials such as ceramic. When the converter is operated in the vacuum of space with no chamber surrounding the converter, evaporating contaminants will acculumate to a lesser extent; then vapor pressure considerations are less important and materials of higher vapor pressure such as some plastics also may be suitable.

The electrode elements 12-15 may be secured in the base 18 by forming the base material around the elements while they are being held in a suitable jig, in the case of a moldable material such as epoxy, the jig serving to hold the elements in their proper relationship until the base material cures around the elements to form slots as indicated at 22-25. Where a machinable material such as ceramic is used, the slos 22-25 may be milled or otherwise formed in the base to receive the elements 12-15 respectively. The base 18 secures the elements against relative movement, holding them in the required geometrical array wherein the front and rear faces of the electrodes are in spaced, substantially parallel relationship with corresponding rear and front faces, respectively, of adjacent electrodes.

Where the converter 10 is to be used in a terrestrial environment, a vacuum chamber 20 is provided to prevent contamination of the photoemissive coating, as well as to reduce the space impedance between the electrodes and to permit electron flow therebetween. Chamber 20 may be of conventional construction, and may be in the form of a sealed tube, as illustrated in section in FIG. 1. The tube 20 is formed at least in part of glass or other transparent material to permit light to reach the photoemissive elements 12-15, with the particular material used being dependent upon the wavelengths to which the elements respond. If the electrode elements are of a material which responds most effectively to ultraviolet light, the container wall must be of a material such as quartz which passes wavelengths in the ultraviolet range. On the other hand, where the converter is built for use in the vacuum of outer space a vacuum chamber is not required; all that is required is a suitable converter to be deployed for proper exposure to the sun.

In FIG. 1 the converter elements are shown as being generally square for convenience of illustration, and such a configuration may be desirable where the unit must be enclosed in a vacuum chamber. However, it is contemplated that a more usual configuration would utilize elongated, generally rectangular surfaces to provide increased area for the reception of light. The principal feature of the geometrical array used in the present invention is that the corresponding front and rear faces of the electrode elements are generally in a parallel, spaced relationship with opposing front and rear faces of adjacent electrodes and the interposed space defining what may be termed a voltage cell. The electrode elements are so arranged that light will fall only on one surface of each element and that surface becomes the photoemissive, or cathodic, surface of that element. The remaining surface of the electrode is arranged to be in shadow so that it does not emit electrons, even if it happens to be made of a photoemissive material, and this nonilluminated surface becomes the anodic, or collector, surface of the electrode. Each electrode is so arranged, therefore, as to have both an anode and a cathode surface, and the converter array is so arranged that, with the exception of the two ends of the converter unit, each electrode forms part of two adjacent voltage cells. Thus, a given electrode element provides the anode for one cell and the cathode for an adjacent electrode, with the conductive material of the electrode itself serving to electrically connect the two cells in series.

Figure 2:
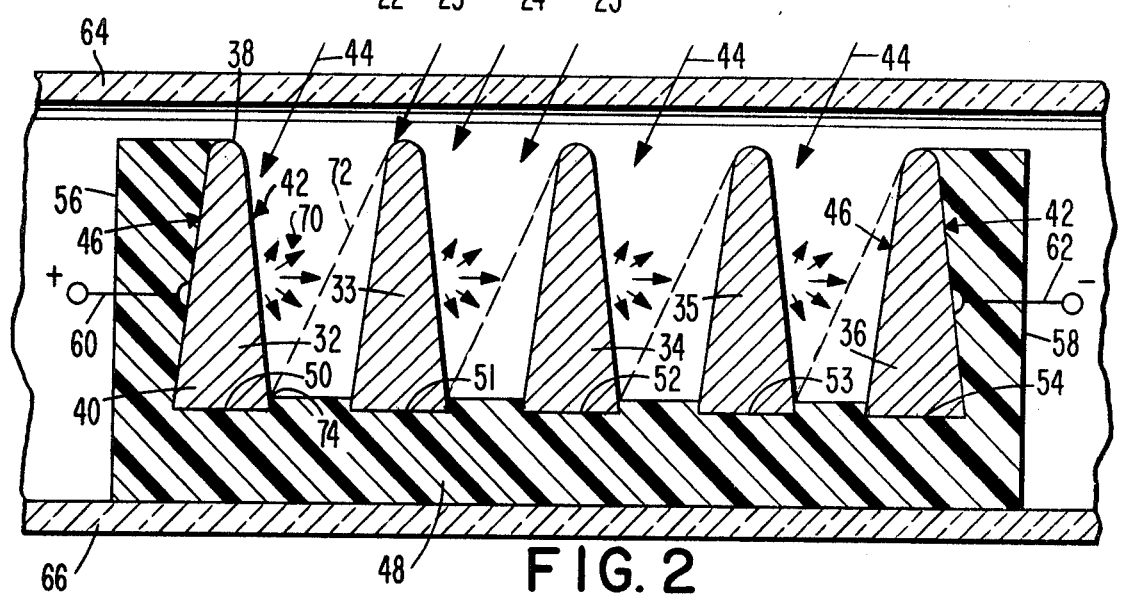
FIG. 2 is a sectional view of a modified version of the device of FIG. 1, showing a modified form of the photoemissive electrode and of the insulating support material.

A modified form of the array of FIG. 1 is shown in cross-section in FIG. 2, which serves to illustrate the manner in which the photoemissive elements are arranged with respect to each other and with respect to the impinging light rays. In this figure, photoemissive elements 32-36 are indicated as comprising elongated sheets of an electrically conductive, photoemissive material such as aluminum. Each element is tapered outwardly from its top portion indicated, for example, at 38 for element 32, to its bottom 40, a slightly tapered shape being preferred since it presents either the front or the rear surface at a favorable angle for reception of incident light, while permitting the opposite surface to remain unilluminated. The direction of current flow and the polarity of the voltage produced by the converter will depend on whether the front or the rear surfaces of the electrodes are illuminated; however, for convenience the surface 42 will be referred to as the front, or forward surface, and in the presence of light rays 44 angled toward that surface, will be the photoemissive surface. The remaining surface 46 will then be referred to as the rear, or rearward, surface which will remain in shadow in the presence of light rays 44 to function as an anode, or collector for emitted electrons. It will be understood that each of the electrodes 33-36 is similar to electrode 32, having corresponding tops 38, bottoms 40, and front and rear surfaces 42 and 44, respectively. Although the electrodes are slightly tapered, the front and rear faces of adjacent electrodes are substantially parallel to insure an efficient collection of emitted electrons, as will be explained. The tapered shape of the elements 32-36 provides a relatively wider bottom area 40 for each element to insure a stable mounting in a support base 48. As indicated above with respect to FIG. 1, the base 48 is an electrically insulating material having characteristics suited to the environment in which the converter is to operate. In the FIG. 2 illustration, the insulating material incorporates slots 50-54 which receive the elements 32-36 to support them in parallel alignment.

The base 48 is shown in the embodiment of FIG. 2 as having an opposite end supports 56 and 58 which serve to support and at the same time shield the outer faces of the endmost electrodes 32 and 36. End support 56 thus covers the rearward surface 46 of element 32 to prevent light rays 44 from reaching that surface, thereby insuring that only its forward surface 42 will be photosensitive and that electrode 32 will act as a cathode in the presence of light rays incident from the direction indicated at 44. In similar manner the opposite end support 58 covers the forward surface 42 of element 36, insuring that none of the light rays 44 will fall on that surface, so that element 36 will serve as an anode to the converter. Suitable electrical leads 60 and 62 are connected to elements 32 and 36, respectively, across which appears the voltage generated by the converter device.

A suitable vacuum environment is provided for the converter of FIG. 2, to permit a flow of emitted electrons from a cathode surface toward an adjacent anode surface. This environment may be provided by operating the device in outer space, or by enclosing it in a vacuum chamber diagrammatically indicated by upper and lower walls 64 and 66. At least a portion of the upper wall 64 is transparent to the wavelength of light to which the elements 32-36 respond to produce photoemission of electrons, and in this embodiment both walls are shown to be of a transparent material.

In the light converter array of FIG. 2, light wave energy in the form of parallel rays 44 enters the converter and impinges upon the photoemissive elements contained therein. The converter is so positioned with respect to the light source, and the elements are so geometrically arrayed, that the incident light waves 44 strike only the forward surfaces 42 of the elements 32-35, the forward surface of element 36 being covered. The energy of the photons impinging on surfaces 42 is transferred to the surface material and serves to eject electrons from these surfaces, the number of electrons ejected being dependent on factors such as the wavelength and intensity of the light, the material of the surfaces 42 of the elements, and the like. Further, the photon energy transferred to a surface is dependent on the effective area of that surface, and thus is a trigonometric function of the angle at which the light rays strike it. Since most of the electrons ejected from a photoemissive surface will travel in a direction substantially perpendicular to the surface, with the remaining electrons travelling in other directions, the numbers of electrons ejected from the surface 42 will generally follow a pattern such as that indicated by arrows 70 in FIG. 2. This ejection of electrons causes the forward surfaces 42 of the electrode elements 32-35 to function as cathodes.

Considering the operation of the converter of FIG. 2 in detail, it will be seen that, because of the particular geometry of the present array, the majority of electrons emitted by the forward surface of element 32 traverse the space between elements 32 and 33 and are intercepted by the rearward surface 46 of the next adjacent electrode 33, surface 46 thereby serving as an anode. Although some of the electrons emitted by the surface 42 of element 32 will not reach the anode and thus will be lost, the aspect ratio of the adjacent cathode and anode surfaces 42 and 46 of electrodes 32 and 33 respectively, is such that a high conversion efficiency is attained. The aspect ratio is determined by the relative sizes and locations of the adjacent electrodes, and thus is a function of the geometry of the array. The closer together the elements 32 and 33 are, the more electrons will be intercepted by the anode surface; however, if the spacing is too close the amount of light energy that can reach the emitting cathode surface will be reduced. Thus, the elements 32 and 33 are spaced sufficiently far apart that element 33 does not cast a shadow on the emitting surface 42 of element 32; preferably the shadow line, indicated by dotted line 72, will fall at or very near the foot 74 of surface 42 so that the maximum emitting surface is available.

In order to enable the rearward surface 46 of element 33 to function effectively as an anode, surface 46 must not be an emitter of electrons. If the electrode element 33 is constructed from a single photoemissive material, emission from surface 46 may be avoided by spacing the elements and angling the front and rear faces of the elements so that the rearward surface 46 is in shadow, as indicated by shadow line 72. To insure that surface 46 of element 33 is in shadow, the converter unit is disposed so that the light rays 44 impinge on it at an angle, the particular angle depending upon the relative height and spacing of the elements and the taper, or relative angles, of the forward and rearward surfaces 42 and 46. The geometry of the photoemissive elements must, therefore, be consistent not only with the optimum angle of light incidence for maximum photoemission, but also with the efficient capture of emitted electrons by the adjacent anode. These factors must be balanced to produce an aspect ratio for the elements which will maximize the electrical output from a given light source. These objectives are attained by a vertical or slightly angled emitting surface 42, a spaced anode surface which is of sufficient size and is so located that it subtends a large solid angle as viewed from the emitting surface so as to block a substantial portion of the emitted electrons, and an angle of incidence which illuminates the cathode while the anode is in shade. Since the emitted electrons are of low energy, the spacing between adjacent elements that will permit operation of the device will also depend upon the degree of vacuum in which the converter operates. With a good vacuum the electrode elements can be widely spaced, while a poor vacuum requires close spacing; thus the optimum spacing is dependent upon the space impedance between the cathode and its anode. It will be noted that since photoemission is relatively independent of the angle of incidence of the light rays, as long as the rays are not simply reflected by the emissive surface the exact dimensions of the converter are not critical; thus, the present invention provides latitude in the design of a particular converter to permit accommodation to such variable facts as the intensity and wavelength of the light, the materials used, and the environment in which the device is to operate.

When light falls on the cathode surfaces of electrode element 32, the ejected electrons migrate to the anode surface 46 of element 33, collecting these electrons to produce a net voltage between the cathode and anode; thus the spaced anode and cathode surfaces define a voltage cell. In similar manner, the forward surface 42 of element 33 receives light rays 44 and, being of a photoemitting material, acts as a cathode to emit electrons. These electrons are ejected in the direction of anode surface 46 of the next adjacent element 34, which collects the electrons. Thus, the opposed surfaces 42 and 46 of elements 33 and 34, respectively, form a second voltage cell. Light falling on the cathode surfaces of elements 34 and 35 also causes ejection of electrons to produce additional voltage cells. The final element 36 serves as an anode for the cathode surface of element 35. Since each of the electrode elements is constructed from an electrically conductive material, the elements themselves connect the several voltage cells formed by the cathode and anode surfaces in series between the two conductors 60 and 62, thereby producing a voltage across the entire coverter which is the sum of the voltages of the individual cells.

The power that may be derived from the converter of the present invention across the conductors 60 and 62 may be expressed mathematically in terms of the variables which enter into the operation of the devices. Thus, this power P in watts may be expressed as follows:

$$P = |V| \cdot I = |V| \cdot \alpha \int_{\frac{|V|}{n}e}^{\epsilon_{max}} F(\epsilon) d\epsilon$$

where:

$$|V| \leq n \frac{\epsilon_{max}}{e} \text{ and } F(\epsilon) = AYF_\gamma$$

and where $\epsilon$ is the energy of a photoelectron, in joules; $e$ is the charge of a single electron in coulombs, $\alpha$ is the retentivity factor for emitted electrons, accounting for the electrons which do not reach the anode surface of the cell due to electrostatic deflection or space-charge limitation of the current; $V$ is the voltage across the battery of cells, in volts; $I$ is the current through the device, in amperes; $Y$ is the photoelectric yield coefficient (electrons per photon) of the material; $A$ is the effective area of the emitting surface of a cathode in square meters, as seen from the illumination source; $n$ is the number of cells; $F\gamma$ is the flux of the impinging photons which are capable of ejecting photoelectrons of energy $\epsilon$; $V/n\ e$ is the energy required for a photoelectron to travel from a cathode to the adjacent anode; and $\epsilon_{max}$ is the maximum photoelectron energy.

From the foregoing formulation, it will be seen that the voltage from the converter, and from each cell, will depend upon a number of factors, such as the intensity of the light, the materials used, and the like. Another factor, which serves to limit the flow of electrons, is the emission of electrons by the anode surfaces 46, which, although in the shadow of direct light, may receive sufficient reflected light to become emissive. Such back emission tends to produce a reverse current flow which reduces the net voltage across the cells. This effect may be produced by utilizing electrode elements such as that illustrated at 80 in FIG. 3, wherein the material from which the element is constructed is electrically conductive, but not necessarily photoemissive. This element is provided with a photoemissive material 82 on the forward surface to form the required cathode, the conductive material of the rearward surface 84 functioning as an anode. The photoemissive layer 82 may be a cesium containing material, gallium arsenide, or some other suitable photoemitter, and since photoemission is essentially a surface effect, this layer may be very thin.

Figure 3:
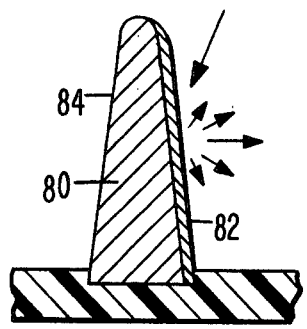
FIG. 3 is a partial sectional view of another form of the invention showing a modified photoemissive electrode.

Although an arrangement as that shown in FIG. 3 has the advantage of providing greater freedom in positioning the converter with respect to the light source since it is not necessary to shade the anode surface, it has the disadvantage of being harder to make and often more expensive than the configuration of FIGS. 1 and 2. Further, environmental conditions may cause a sputtering off of the layer of photoemissive material and its subsequent deposit on the anode surface, thereby reducing the effectiveness of the converter.

Figure 4:
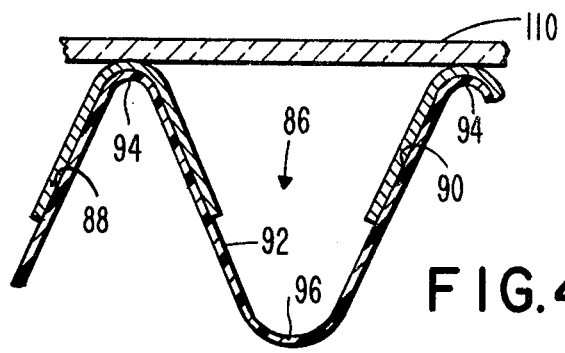
FIG. 4 is a partial sectional view of still another form of the invention.

In order to obtain high power output levels from a solar energy converter, it is necessary to provide means for deploying large surface areas of photoemissive material. In the prior art, the provision of large surface areas required structural support members of great complexity and cost. With the arrangement of the present invention, however, the needed high output levels can be obtained easily and at reasonable cost through the provision of the structure illustrated in FIG. 4. In this embodiment, the array 86 comprises a plurality of spaced strips 88, 90 of an electrically conductive photoemissive material such as a cesium containing material mounted on a sheet of electrically insulating sheet material 92 such as Mylar or other plastic. The photoemissive strips 88, 90 are plated or evaporated onto the surface of the sheet 92, and the sheet is folded into a series of accordion pleats so that each of the upwardly folded pleats 94 occurs at the longitudinal center of one of the photoemissive strips, and each of the downwardly folded pleats 96 occurs between the strips. This causes each of the strips 88, 90 to assume the general shape of the anode and cathode surfaces of the elements 32-36 illustrated in FIG. 2, and the strips may therefore be used in the same manner as the FIG. 2 elements. The sheet 96 may be secured in its folded shape by means of suitable structural elements such as braces (not shown) or may be thermally set to its desired shape after folding. It will be apparent that in the arrangement of FIG. 4 the folds may be formed to provide any desired degree of taper for the elements; and to provide the desired spacing and relative angles between adjacent surfaces. It is also obvious that a number of converters can be made on the same sheet and be connected in series.

Figure 5:
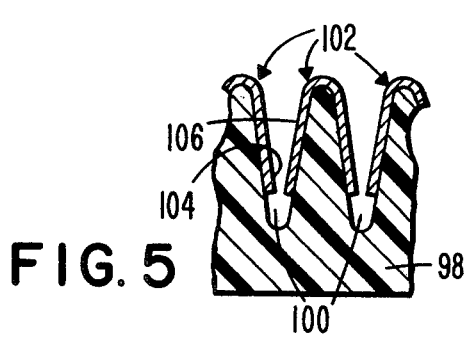
FIG. 5 is a partial sectional view of yet another form of the invention.
Figure 6:
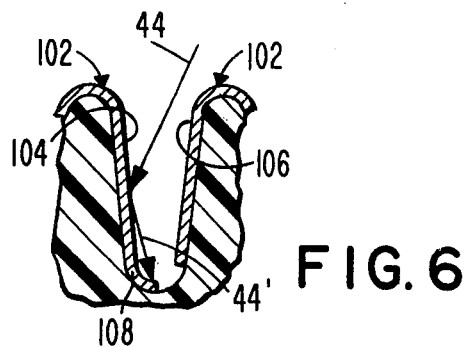
FIG. 6 is an enlarged view of a portion of the device of FIG. 5.

Another form of the device, and one which has major advantages, is illustrated in FIGS. 5 and 6, wherein an electrically insulating sheet or slab 98 into which grooves or slots 100 have been cut or otherwise formed is provided. The grooves or slots can be made by a number of techniques, including molding, milling, for example, or by masking and etching techniques such as are commonly used in the semiconductor industry. A photoemissive material 102 is applied to the upper, slotted surface of slab 98 in such a way that the bottom of each groove or slot 100 is free of such material. This may be done by conventional selective coating techniques, including, for example, the use of a removable mask or the use of milling or etching processes.

A structure such as that shown in this figure may be fabricated very inexpensively, while retaining the strength and structural integrity of the device. The surface material 102 conforms to the surface configuration of the grooves, forming inverted U-shaped electrodes, each of which has a forward leg surface 104 and a rearward leg surface 106. The ajdacent electrode leg portions 104 and 106, respectively, of the side-by-side electrodes 102 form adjacent voltage cells, as in the prior configurations of the device. Again, the photoemissive material is electrically conductive to connect the voltage cells in series.

The process of coating the photoemissive material on the insulating base 98 permits the use of very narrow grooves, on the order of 1 mil in width for example, so that the vacuum gap between the electron-emitting and electron-collecting surfaces 104 and 106 can be made very small. As is well known, very narrow gaps between anode and cathode surfaces in a voltage cell have the advantage of involving very little in the way of space-charge limitations on the current flow. Thus, the device disclosed herein is capable of producing very high currents at very low cost.

To maximize the transfer of photon energy, the reflection of incident light energy from the photoemissive surface 104 of the device of FIG. 5 may be reduced by roughening the surface or by other surface treatment techniques known to the art. Also, the photoemissive cathode 104 may be designed to have a curved or extended form, as illustrated at 108 in FIG. 6, so that some of the photons 44 reflected by the photocathode, which might otherwise be lost, will impinge upon the surface of extension 108. This curvature of the photocathode will provide some improvement in the efficiency of energy conversion.

Although the geometric arrangement of the electrode elements as illustrated herein insures an efficient operation, it will be appreciated that a transparent insulator (sheet or mesh) may be provided above the converter to direct, by means of the surface charge which the insulator will develop, the electron flow from the cathode to the anode and in some situations this may provide an improved operation. Such an insulator sheet is shown at 110 in FIG. 4. The principal elements of the invention, however, are the arrangement of photoemissive electrodes to produce electron ejection in a preferred direction, interposing anode electrodes in the paths of these electrons, and providing a succession of such elements to produce a relatively high voltage output. It will be noted that the converter so produced will be a low current device, with the current level being limited by the photoemissivity of the material used in the cathode elements and by space-charge between the electrodes. When the converter device is connected as a voltage source across a load, the resulting current flow will be equal to that produced in each voltage cell by the incident light, and the voltage across the converter will be the sum of the voltage across each cell. The larger the surface areas of the cathodes and anodes, therefore, the larger will be the current which can flow through the device. As long as a current is drawn from the converter, electron flow will continue in each cell. If the load is removed from the converter, the continuing emission of electrons from each cathode surface will produce an accumulation of electrons on the corresponding anode surfaces which will create an electrostatic voltage within each cell that will build up to the capacity of the cell, at which time emitted electrons will no longer flow from the cathode to the anode.

Although the present invention has been described in terms of specific embodiments, it will be understood that numerous variations and modifications will be available to those of skill in the art without departing from the true spirit and scope thereof, as set forth in the accompanying claims.

What is claimed is:

1. An improved converter for converting light energy to electrical energy comprising:
   a plurality of electrically conductive electrode elements each having a first, photoemissive surface and a second, anode surface;
   means mounting said electrode elements in spaced, insulated relationship, said first surface of each electrode element facing said second surface of the next adjacent electrode element, each pair of facing surfaces and the intervening space therebetween defining a voltage cell and said plurality of elements defining a plurality of voltage cells in series, said mounting means securing said electrodes in geometrically arrayed, generally parallel relationship so that incident light will produce photoemission from only the first surface of each voltage cell, the second surface of each voltage cell being so positioned as to intercept the electrons from its corresponding first surface.

2. The converter of claim 1, wherein said second surface of each of said electrode elements is constructed of photoemissive material and wherein said electrode elements are constructed so as to leave said second surfaces in shadow when light rays illuminate said first surfaces.

3. The converter of claim 1, wherein said second surface of each of said electrode elements is comprised of a nonphotoemissive material.

4. The apparatus of claim 1, wherein said means mounting said electrode elements comprises an electrically insulative support base whereby the bases of said plurality of electrode elements are electrically insulated from each other so that current flow through each of said voltage cells is restricted to the space between said first and second electrode surfaces, and wherein the forward and rearward faces of said electrode elements are tapered downwardly and outwardly to define said first and second surfaces; respectively.

5. The apparatus of claim 1, wherein said means for mounting said electrode elements comprises an electrically insulative support base.

6. The apparatus of claim 1, wherein each of said electrode elements comprises a strip of photoemissive material secured to a foldable electrically insulative sheet, each of said strips being folded to define said first and second surfaces.

7. The apparatus of claim 1, wherein each of said electrode elements is tapered downwardly and outwardly, the forward and rearward surfaces of said elements defining said first and second surfaces, respectively.

8. The apparatus of claim 1, further including conductor means connected to the opposite ends of the converter whereby a voltage is derived across all of said voltage cells in the presence of incident light.

9. A geometric array of photoemissive electrodes for producing output power in the presence of light energy, comprising:
a plurality of electrodes, each electrode being electrically conductive and having a photoemissive cathode surface and an anode surface;
insulating means mounting said electrodes in spaced, parallel relationship, said electrodes being so mounted that incident light strikes only the cathode surface of each electrode, the aspect ratio of adjacent electrodes causing electrons ejected from the cathode surface of each electrode to travel to the anode surface of the next adjacent electrode, and said insulating means electrically insulating said electrodes so that only space conduction occurs between adjacent electrodes, the adjacent cathode and anode surfaces and the intervening space defining a voltage cell, and said plurality of electrodes forming a plurality of voltage cells; and
a first electrical lead connected to a cathode at one end of said converter and a second electrical lead connected to an anode at the other end of said converter, whereby said voltage cells are in series to provide an electrical output voltage equal to the sum of the voltages of the individual cells and an output current equal to the emission current of a single cell.

10. An improved method of generating electrical power, comprising:
mounting a plurality of electrically conductive electrodes in spaced parallel, insulative relationship to provide at least a photoemissive cathode surface on each electrode, all said cathode surfaces facing in a common direction;
evacuating the space between said electrodes;
illuminating only said cathode surfaces to produce photoemitted electron flow from each cathode;
positioning a nonilluminated surface of each of said electrodes to intercept electrons emitted by a next adjacent cathode surface, whereby adjacent cathode and collection surfaces from voltage cells; and
connecting the voltage cells in series to provide a voltage source having an output corresponding to the incident light.

11. An improved method of generating electrical power, comprising:
mounting a plurality of electrically conductive electrodes in spaced, parallel, insulative relationship;
providing at least a photoemissive cathode surface on each of said electrodes, all said cathode surfaces facing in a common direction;
evacuating the space between said electrodes;
illuminating only said cathode surfaces to produce photoemitted electron flow from each cathode;
positioning a nonilluminated surface of each of said electrodes to intercept electrons emitted by a next adjacent cathode surface, whereby adjacent cathode and collection surfaces form voltage cells; and
connecting the voltage cells in series to provide a voltage source having an output corresponding to the incident light.

* * * * *

UNITED STATES PATENT AND TRADEMARK OFFICE
CERTIFICATE OF CORRECTION

PATENT NO. : 4,094,703
DATED : June 13, 1978
INVENTOR(S) : Gregory J. Williams

It is certified that error appears in the above-identified patent and that said Letters Patent are hereby corrected as shown below:

IN THE CLAIMS

Cancel claim 10.

Add the following claim:

--10. An improved solar energy converter comprising:
a plurality of electrically conductive electrodes each having opposing surfaces and being geometrically arrayed so that incident light will strike only one surface of each electrode to produce electron emission;
electrically insulating means mounting said electrodes in spaced, substantially parallel relationship so that electrons emitted by the illuminated surface of one electrode will travel to, and be collected by, a nonilluminated surface of a next adjacent electrode; and
a vacuum between said electrodes, so that only space conduction occurs therebetween.--

Signed and Sealed this

Nineteenth Day of December 1978

[SEAL]

Attest:

RUTH C. MASON
Attesting Officer

DONALD W. BANNER
Commissioner of Patents and Trademarks